United States Patent
Fan et al.

(10) Patent No.: US 11,659,655 B2
(45) Date of Patent: May 23, 2023

(54) TENSILE ELECTRONIC MODULE AND ELECTRONIC DEVICE USING THE SAME

(71) Applicants: INTERFACE TECHNOLOGY (CHENGDU) CO., LTD., Chengdu (CN); INTERFACE OPTOELECTRONICS (SHENZHEN) CO., LTD., Shenzhen (CN); INTERFACE OPTOELECTRONICS (WUXI) CO., LTD., Wu Xi (CN); GENERAL INTERFACE SOLUTION LIMITED, Miaoli County (TW)

(72) Inventors: Chia Ming Fan, Shenzhen (CN); Po Lun Chen, Shenzhen (CN); Chun Ta Chen, Shenzhen (CN); Po Ching Lin, Shenzhen (CN); Ya Chu Hsu, Shenzhen (CN); Chin I Tu, Shenzhen (CN); Kuo Fung Huang, Shenzhen (CN)

(73) Assignees: Interface Technology (Chengdu) Co., Ltd., Chengdu (CN); Interface Optoelectronics (Shenzhen) Co., Ltd., Shenzhen (CN); Interface Optoelectronics (Wuxi) Co., Ltd., Wu Xi (CN); General Interface Solution Limited, Miaoli (TW)

( * ) Notice: Subject to any disclaimer, the term of this patent is extended or adjusted under 35 U.S.C. 154(b) by 0 days.

(21) Appl. No.: 17/453,541

(22) Filed: Nov. 4, 2021

(65) Prior Publication Data

US 2023/0096896 A1    Mar. 30, 2023

(30) Foreign Application Priority Data

Sep. 27, 2021    (CN) .......................... 202111136865.7

(51) Int. Cl.
   *H05K 1/02* (2006.01)

(52) U.S. Cl.
   CPC .................................. *H05K 1/0283* (2013.01)

(58) Field of Classification Search
   CPC .......................... H05K 1/0283; H05K 1/0277
   See application file for complete search history.

(56) References Cited

U.S. PATENT DOCUMENTS

| | | | |
|---|---|---|---|
| 2004/0192082 A1* | 9/2004 | Wagner | H05K 1/0283 439/67 |
| 2016/0014889 A1* | 1/2016 | Markus | H05K 1/028 174/254 |

* cited by examiner

*Primary Examiner* — Jeremy C Norris
(74) *Attorney, Agent, or Firm* — Rosenberg, Klein & Lee

(57) ABSTRACT

A tensile electronic module and electronic device using the same are provided. The tensile electronic module includes two electrical components and a stretchable trace connected between the two electrical components. The stretchable trace includes two arcs and at least three circular segments. The circular segments are connected to each other and have at least two various central angles. Each of the arcs is configured at one end of the circular segments for respectively connecting with one of the electrical components. The tensile electronic module proposed in the invention achieves to reduce tensile stress of the stretchable trace in multiple directions and can be further applied to an electronic device which is stretchable or having a curved surface. Damages caused by stress accumulation when the stretchable trace is stretched in different directions are therefore avoided. Therefore, it is believed reliability and service life of the electronic device are greatly improved.

16 Claims, 8 Drawing Sheets

TENSILE ELECTRONIC MODULE AND ELECTRONIC DEVICE USING THE SAME

CROSS-REFERENCE TO RELATED APPLICATION

This application claims priority of Application No. 202111136865.7 filed in China on Sep. 27, 2021, under 35 U.S.C. § 119; the entire contents of all of which are hereby incorporated by reference.

FIELD OF THE INVENTION

The present invention is related to a technical field of stretchable electronics. More particularly, it is related to a tensile electronic module and an electronic device using the same.

DESCRIPTION OF THE PRIOR ART

In accordance with the rapid changes in electronic product markets nowadays, stretchable electronics are known as having extraordinary development potential and thus have become one of the most targeting industries in the next generation. Advantages of the stretchable electronics include its miniaturized structure, light weight, and great flexibility, which make the stretchable electronics easy to conform with various product designs. And therefore, the application fields of the stretchable electronics include a variety of consumer products, such as rollable or foldable mobile phones, foldable tablets, laptop computers, intelligent wearable equipment, curved televisions, or dashboards. Furthermore, other related technical fields including stretchable sensors and radio frequency identification, plastic and stretchable display devices, stretchable electronic products, stretchable solar cells, and intelligent fabrics are also developing extremely rapidly.

One major task of the stretchable electronics is to maintain great stability in the stretchable electronic device. Therefore, it is especially important to consider the stretchability of materials or components and meanwhile to maintain its electrical properties. In general, relating components in the stretchable electronics include a tensile conductive route which is stretchable. One implementation to form the stretchable tensile conductive route is to directly use a conductive material that is stretchable, such as silver paste, carbon paste, carbon nanotubes, conductive polymer materials to form the tensile conductive route. Another implementation is to employ a physical structural design to stretch the material. For example, the substrate material can be pre-stretched to provide a certain structure having expansion space (such as a wrinkle structure). And therefore, when it is stretched by an external force, then the structure will be able to tolerate a certain amount of stretches. Alternatively, if part of the structure is not stretchable (for example, the area to dispose electrical components), then it is also practical to design the connections between the electrical components (for example, providing a curved connection there in between the electrical components) so as to make the stretchable stretchable trace as required.

Please refer to FIG. 1. A conventional tensile electronic module includes a stretchable stretchable trace 1 which has a curved structure. By connecting the stretchable stretchable trace 1 between the areas where the electrical components 2 are disposed, it makes the whole electronic module tensile and stretchable. It can be observed in the figure that the curved structure of such a stretchable stretchable trace 1 is to curve the route along with the stretched direction for reducing the tensile stress generated on the route. In the existing prior arts, most of the stretchable traces are merely having a single curved angle. Therefore, only stress in one direction can be reduced. However, when it is applied by a multi-directional stretching force (for example, in a thermo-forming process), then the conventional stretchable trace having only a single curved angle can not be used to effectively eliminate the tensile stress from a variety of stretching directions.

Therefore, on account of above, to overcome the above-mentioned problems, it should be obvious that there is indeed an urgent need for the professionals in the field for proposing a new and modified stretchable trace structure to be developed that can effectively solve the above mentioned problems occurring in the prior design. And by using such novel structure, the above-mentioned deficiencies of the prior arts can be solved, which is indeed the subject that those skilled in the art should urgently put efforts and develop in the industry. Hereinafter, the detailed specific implementations will be fully described in the following paragraphs.

SUMMARY OF THE INVENTION

In order to overcome the above-mentioned disadvantages, one major objective in accordance with the present invention is to provide a tensile electronic module and an electronic device in which the tensile electronic module is applied to. By designing a curved structure of the stretchable trace to have a variety of curved angles, the proposed tensile electronic module is effective in reducing tensile stress of the stretchable trace occurring in multiple directions.

Another objective in accordance with the present invention is provided for a tensile electronic module and an electronic device using the same, wherein the proposed tensile electronic module is able to be further applied to the electronic device which is stretchable or having a curved surface in order to prevent the stretchable trace from damages caused by stress accumulation of the external forces in multiple stretching directions. As a result, it is believed that the product reliability and the product service life of the electronic device can be greatly improved.

Therefore, for achieving the above-mentioned objectives, the present invention is aimed to provide a tensile electronic module which comprises two electrical components and a stretchable trace. The disclosed stretchable trace is connected between the two electrical components, and the stretchable trace includes two arcs and at least three circular segments. The circular segments are connected to each other and have at least two various central angles. Each of the two arcs is disposed at one end of the circular segments for respectively connecting with one of the two electrical components.

In another aspect, the present invention is also aimed to provide an electronic device, which comprises a substrate and a tensile electronic module. The proposed tensile electronic module comprises two electrical components and a stretchable trace. The two electrical components are disposed on the substrate. The stretchable trace is disposed on the substrate and connected between the two electrical components. The stretchable trace includes two arcs and at least three circular segments. The circular segments are connected to each other and have at least two various central angles. Each of the two arcs is disposed at one end of the circular segments for respectively connecting with one of the two electrical components.

According to one embodiment of the present invention, the disclosed substrate is stretchable or is a substrate which has a fixed curvature.

In one embodiment of the present invention, the disclosed substrate, for instance, can be a piece of paper, plastic film, metal film, cloth, a silicon substrate or a glass substrate.

In addition, according to one embodiment of the present invention, the central angles of two adjacent circular segments of the at least three circular segments are different.

Alternatively, according to one embodiment of the present invention, the central angles of each of the at least three circular segments are different.

And yet, in a preferred embodiment of the present invention, each of the various central angles is in a range between 90 degrees and 270 degrees.

According to the technical characteristics disclosed in embodiments of the present invention, the at least three circular segments may have a same radius.

Alternatively, the at least three circular segments may have a different radius.

And in one embodiment of the present invention, the two arcs can be circular arcs.

According to one embodiment of the present invention, the disclosed stretchable trace can be made of at least one material selected from a group consisting of copper, aluminum, silver, gold, titanium, molybdenum and nickel.

As a result, in view of the various embodiments provided above by the present invention, it is apparent that, compared with the existing prior arts, it is evident that the present invention is characterized by a plurality of following advantages:

(1) The proposed tensile electronic module provided by the present invention is mainly aimed to design the curved structure of the stretchable trace into a variety of curved angles. As a result, compared to a conventional stretchable trace which has merely one single curved angle, the proposed stretchable trace which has a variety of curved angles effectively achieves to reduce tensile stress of the stretchable trace occurring in multiple directions.

(2) The proposed tensile electronic module can be further applied to an electronic device which is stretchable or having a curved surface, so as to prevent the stretchable trace from damages caused by stress accumulation of the external forces in multiple stretching directions. And therefore, structural damages and performance degradations of the electronic device due to such stretching conditions can also be avoided, thereby ensuring the product performance and extending the product service life of the electronic device confirmatively.

In the following descriptions, the Applicant further elaborates the present invention with more detailed embodiments and accompanying drawings for these and other objectives of the present invention as being obvious to those of ordinary skill in the art after reading the following detailed description of preferred embodiments.

It is to be understood that both the foregoing general description and the following detailed description are merely exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
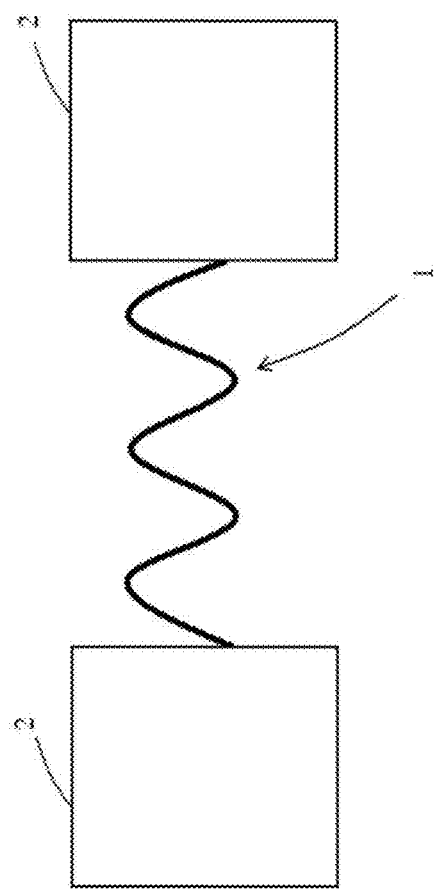
FIG. 1 schematically shows a structural diagram of a conventional tensile electronic module in the prior art.

Reference will now be made in detail to the preferred embodiments of the present invention, examples of which are illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

In the entire specification and claims, unless the contents clearly specify the meaning of some terms, the meaning of the article "wherein" includes the meaning of the articles "wherein" and "whereon". The meanings of every term used in the present claims and specification refer to a usual meaning known to one skilled in the art unless the meaning is additionally annotated. Some terms used to describe the invention will be discussed to guide practitioners about the invention. Every example in the present specification cannot limit the claimed scope of the invention.

The terms "substantially," "around," "about" and "approximately" can refer to within 20% of a given value or range, and preferably within 10%. Besides, the quantities provided herein can be approximate ones and can be described with the aforementioned terms if are without being specified. When a quantity, density, or other parameters includes a specified range, preferable range or listed ideal values, their values can be viewed as any number within the given range.

In order to clarify the objectives, technical contents, and advantages of the embodiments of the present invention, the Applicants will provide clear and complete descriptions in the below to fully describe the technical solutions in accordance with the embodiments of the present invention. Obviously, the described descriptions merely show a partition of the embodiments of the present invention, which do not present all. In general, based on the embodiments of the present invention, all the other variations made by those skilled in the art without paying additional creative work shall still fall within the claim scope of the present invention. It should be noted that, under the circumstances while no conflict is to be made, the embodiments of the present invention and the features in the embodiments are able to be mutually combined with each other arbitrarily.

As described earlier in the previous prior arts, since the existing conventional tensile electronic module simply uses a stretchable stretchable trace having merely a single curved angle, which fails to effectively eliminate the tensile stress in multiple directions, the present invention is proposed to solve these issues and discloses a novel solution, which comprises a tensile electronic module and an electronic device using the same. The present invention is aimed to be proposed to modify a stretchable trace of the tensile electronic module.

Figure 2:
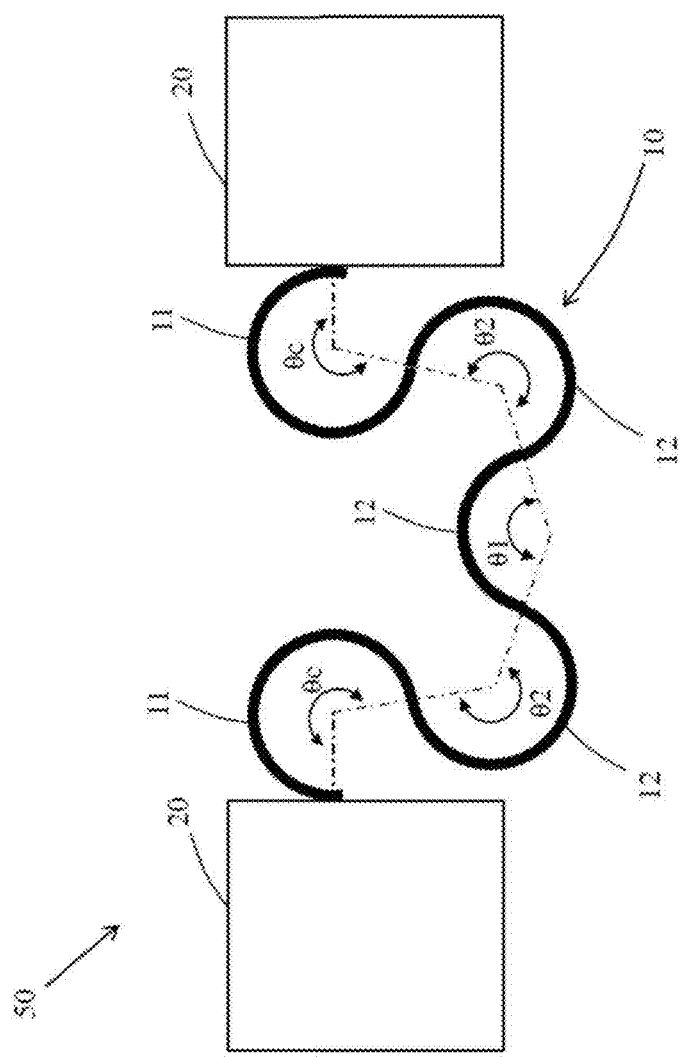
FIG. 2 schematically shows a structural diagram of a tensile electronic module including a stretchable trace which has various curved angles in accordance with a first embodiment of the present invention.

Please refer to FIG. 2, which schematically shows a structural diagram of a tensile electronic module 50 including a stretchable trace 10 which has various curved angles in accordance with a first embodiment of the present invention. According to the first embodiment, the tensile electronic module 50 comprises two electrical components 20 and a stretchable trace 10. The two electrical components 20 are separated from each other, and the stretchable trace 10 is connected between the two electrical components 20. The stretchable trace 10 comprises two arcs 11 and three circular segments 12, wherein the three circular segments 12 are connected to each other and each of the two arcs 11 is disposed at one end of the three circular segments 12 for respectively connecting with one of the two electrical components 20. The three circular segments 12 have two various central angles $\theta1$, $\theta2$, which are also known as two various curved angles. By employing such a structural design, the present invention is effective to reduce the stress accumulation on the stretchable trace 10 when the stretchable trace 10 is stretching in a variety of different directions.

Figure 3:
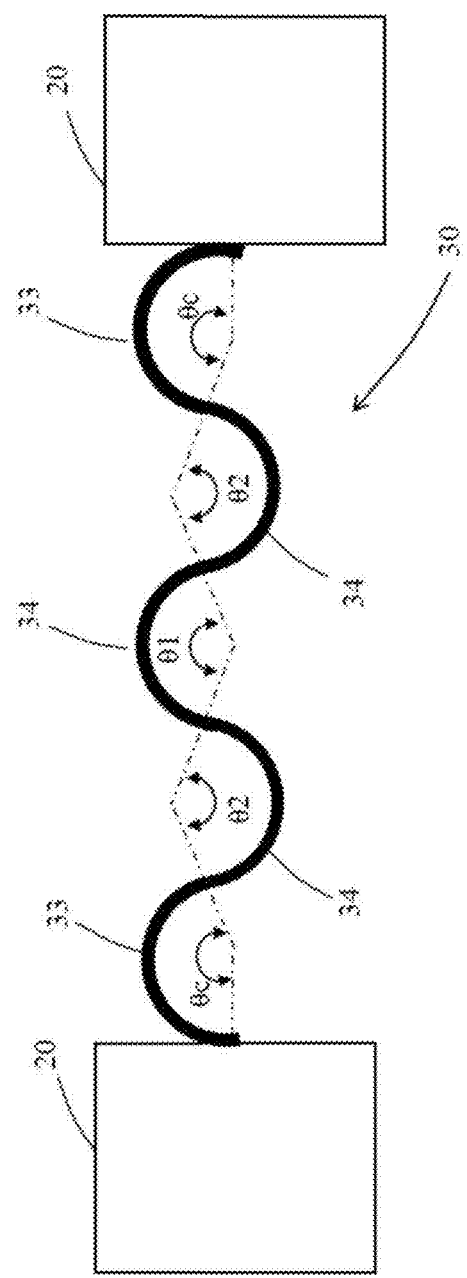
FIG. 3 schematically shows a structural diagram of a tensile electronic module including a stretchable trace which has merely one single curved angle.

In order to completely explain how the present invention defines the curved angles of the stretchable trace in details, please refer to FIG. 2 together with FIG. 3 at the same time, in which FIG. 3 schematically shows a structural diagram of a tensile electronic module which includes a stretchable trace 30 having merely one single curved angle. As illustrated in FIG. 3, the stretchable trace 30 is composed of five connecting curves (including curves 33 and curves 34). And the "single curved angle" means that, except for the curves 33 located on two opposite ends of the stretchable trace 30, the curves 34 in the middle of the stretchable trace 30 all have the same curved angle. Here in the embodiment, these curves are illustrated as circular arcs and the curved angle is shown as a central angle. When the stretchable trace 30 is connected with the electrical components 20 which are not stretchable, each of the two curves 33 located on an opposite end of the stretchable trace 30 for connecting with the electrical component 20 has a central angle $\theta c$. Each of the three curves 34 connected there in between successively has a central angle $\theta2$, $\theta1$, $\theta2$. And the central angles $\theta1$, $\theta2$ are equal, indicating that $\theta1=\theta2$. If the curves used for composing the stretchable trace 30 are more than five curves (not shown in the figures), then more than three curves 34 will be connected between the two curves 33 configured on two opposite ends of the stretchable trace 30. And, the central angles $\theta1$, $\theta2$, $\theta3$ will be equal, indicating that $\theta1=\theta2=\theta3$. Furthermore, as shown in FIG. 2, the stretchable trace 10 in the first embodiment is composed of five connecting curves, specifically including two arcs 11 and three circular segments 12. The three circular segments 12 connected there in between have various central angles $\theta1$, $\theta2$, indicating that $\theta1$, $\theta2$ are different. As such, the stretchable trace 10 is characterized by having various curved angles. If the curves used for composing the stretchable trace 10 are more than five curves (not shown in the figures), then more than three curves will be connected there in between, which means there will be more than three circular segments 12 to be disposed, and the central angles $\theta1$, $\theta2$, $\theta3$ may all be different, or have at least two various angle values, such that the stretchable trace 10 is characterized by having various curved angles.

In a further aspect, according to the above mentioned embodiment when regarding the stretchable trace 10 structure, each of the two arcs 11 is disposed at one opposite end of the stretchable trace 10, and at least three circular segments 12 are disposed there in between of the stretchable trace 10. These circular segments 12 have at least two various central angles $\theta1$, $\theta2$. As described earlier in the previous paragraphs, the central angles $\theta1$, $\theta2$ of two adjacent circular segments 12 are different. The structures on opposite ends of the stretchable trace 10 can be symmetrical. Therefore, when there are three circular segments 12 to be disposed in the structure, then there will be two various central angles $\theta1$, $\theta2$. And as for while there are five circular segments 12 to be disposed in the structure, then there will be three various central angles $\theta1$, $\theta2$, $\theta3$ (will be discussed later in FIG. 4). However, the present invention is certainly not limited thereto by such configurations of the central angles $\theta1$, $\theta2$, $\theta3$ of the plurality of circular segments 12. For instance, the central angles $\theta1$, $\theta2$, $\theta3$ of each of the plurality of circular segments can be different, which means $\theta1 \neq \theta2 \neq \theta3$ when there are three circular segments 12; and the central angles $\theta1 \neq \theta2 \neq \theta3 \neq \theta4 \neq \theta5$ when there are five circular segments 12 (not shown in the figures). According to the technical contents of the present invention, each of the central angles $\theta1$, $\theta2$, $\theta3$, $\theta4$, $\theta5$ of the circular segments 12 is in a range between 90 degrees and 270 degrees. These circular segments 12 may have a same radius. Alternatively, it is also practicable to design these circular segments 12 to have a different radius. Moreover, the arcs 11 of the stretchable trace 10 may also be circular arcs. And, its angle (central angle $\theta c$) is not limited in the present invention as well.

And yet furthermore, the disclosed stretchable trace proposed by the present invention, can be made of at least one material selected from a group consisting of copper, aluminum, silver, gold, titanium, molybdenum and nickel. In one embodiment of the present invention, the proposed stretchable trace can be fabricated as a metallic layer made of a single material or a metallic layer made of multiple stacked metals. For example, the structure of the stretchable trace can be a stacked metallic layer composed of Mo/Al/Mo or Ti/Al/Ti. The fabrication process of the stretchable trace in the present invention can be implemented by using a general metal wire manufacturing process. For example, it is applicable to employ a yellow light process to pattern the metal into the stretchable trace having various curved angles. Alternatively, it is also applicable to adopt a dispensing or screen printing process such that a conductive silver paste is coated into the stretchable trace having various curved angles in a specified pattern.

Figure 4:
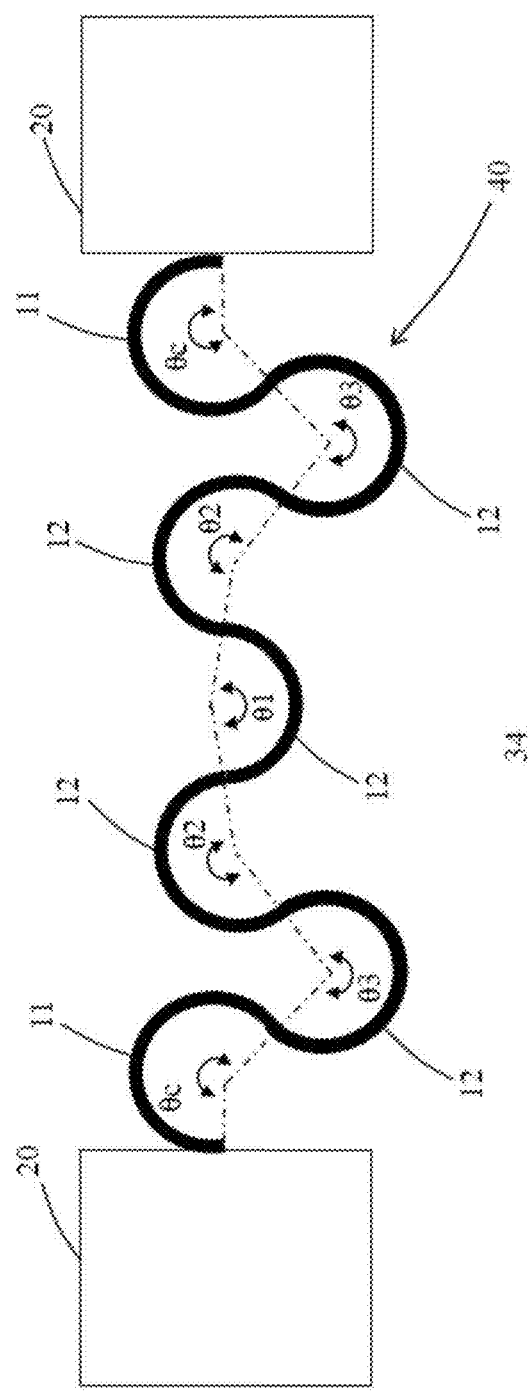
FIG. 4 schematically shows a structural diagram of a tensile electronic module including a stretchable trace which has various curved angles in accordance with a second embodiment of the present invention.

Furthermore, please refer to FIG. 4, which schematically shows a structural diagram of a tensile electronic module including a stretchable trace 40 which has various curved angles in accordance with a second embodiment of the present invention. Compared with the first embodiment, when the two electrical components 20 are separated from each other by an even farther distance, then the stretchable trace 40 can be composed of more connecting curves, indicating that there will be more than three circular segments 12. In such an embodiment, the stretchable trace 40 includes two arcs 11 and five circular segments 12 connected thereto. The five circular segments 12 are connected to each other, and each of the two arcs 11 is disposed at one end of the five circular segments 12 for respectively connecting with one of the two electrical components 20. The five circular segments 12 have three various central angles $\theta1$, $\theta2$, $\theta3$, which means the central angles $\theta1$, $\theta2$, $\theta3$ are different, and thus three various curved angles can be formed.

As what the Applicants have provided and explained earlier in the foregoing descriptions, the stretchable trace 40 in this embodiment includes five circular segments 12. The structures on opposite ends of the stretchable trace 40 are symmetrical. And the central angles $\theta1$, $\theta2$ or the central angles $\theta2$, $\theta3$ of two adjacent circular segments 12 are different. Therefore, the five circular segments 12 are able to have three various central angles $\theta1$, $\theta2$, $\theta3$. However, it is worth noting that, the present invention is certainly not limited thereto by such configurations of the central angles $\theta1$, $\theta2$, $\theta3$ of the plurality of circular segments 12. For instance, the central angles $\theta1$, $\theta2$, $\theta3$ of each of the plurality of circular segments can also be different. As a result, by employing such a configuration, the five circular segments 12 are able to have five various central angles $\theta1$, $\theta2$, $\theta3$, $\theta4$, $\theta5$ (now shown in the figures). According to the technical contents of the present invention, similarly, each of the central angles $\theta1$, $\theta2$, $\theta3$, $\theta4$, $\theta5$ of the circular segments 12 can be designed as in a range between 90 degrees and 270 degrees. These circular segments 12 may have a same radius. Alternatively, it is also practicable to design these circular segments 12 to have a different radius. In addition, the arcs 11 of the stretchable trace 40 may also be circular arcs. And its angle (or central angle) is not limited in the present invention as well.

Figure 5:
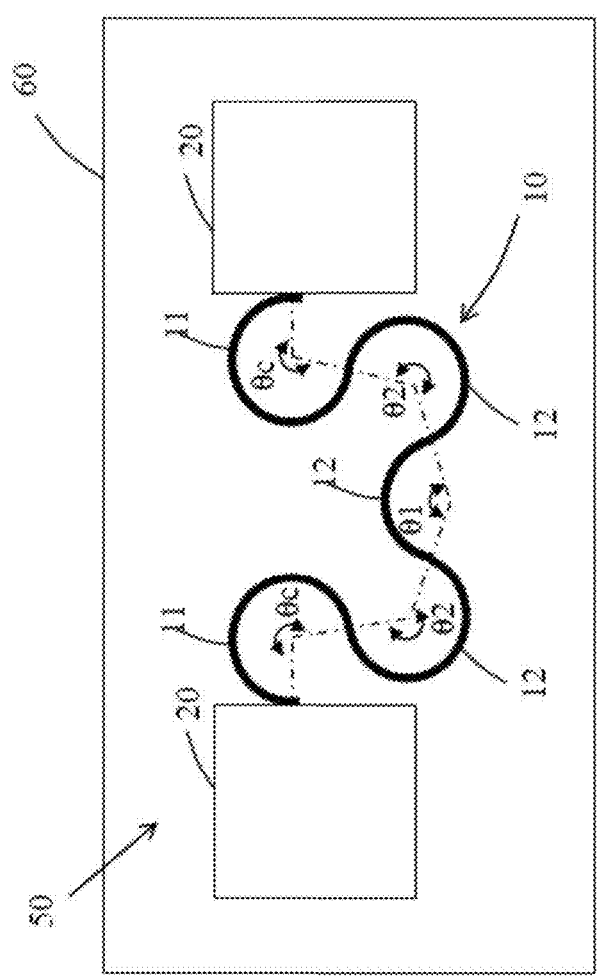
FIG. 5 schematically shows a structural diagram of an electronic device which the proposed tensile electronic module is applied to in accordance with a third embodiment of the present invention.

And furthermore, the tensile electronic module proposed in the invention can be further applied to an electronic device, so as to prevent the stretchable trace from being damaged due to the stress accumulation of various external forces in a variety of directions and to avoid damages and performance degradation of the electronic device when it is stretched in different directions. Please refer to FIG. 5, which schematically shows a structural diagram of an electronic device which the proposed tensile electronic module is applied to in accordance with a third embodiment of the present invention. According to such an embodiment, the tensile electronic module 50 is disposed on a substrate 60 to form the electronic device. The tensile electronic module 50 comprises two electrical components 20 and a stretchable trace 10, wherein the two electrical components 20 are disposed on the substrate 60 and separate from each other. The stretchable trace 10 is disposed on the substrate 60 and connected between the two electrical components 20. The stretchable trace 10 comprises two arcs 11 and three circular segments 12 connected thereto. The three circular segments 12 are connected to each other and each of the two arcs 11 is disposed at one end of the three circular segments 12 for respectively connecting with one of the two electrical components 20. The three circular segments 12 have two various central angles $\theta1$, $\theta2$, which are also known as two various curved angles. Therefore, by employing such a structural design, the present invention is effective to reduce the stress accumulation on the stretchable trace 10 when the stretchable trace 10 is stretching in a variety of different directions, as well as to avoid the structural damage and loss of function of the stretchable trace 10. As a result, it is believed that reliability and service life of the electronic device can be successfully improved.

As illustrated above, the electronic device hereinafter takes the tensile electronic module 50 in the first embodiment as a demonstrative embodiment to explain the technical contents of the present invention, in which the stretchable trace 10 in this embodiment includes three circular segments 12. The structures on opposite ends of the stretchable trace 10 are symmetrical. And the central angles $\theta1$, $\theta2$ of two adjacent circular segments 12 are different. Nevertheless, it is worth noting again that, the present invention is certainly not limited thereto by such configurations of the central angles $\theta1$, $\theta2$ of the plurality of circular segments 12. For instance, it is also practicable to design the central angles $\theta1$, $\theta2$ of each of the plurality of circular segments to be different. As a result, by employing such a configuration, the three circular segments 12 are able to have three various central angles $\theta1$, $\theta2$, $\theta3$ (now shown in the figures). In addition, the proposed electronic device may also alternatively use the stretchable trace 40 which includes five circular segments 12 in the second embodiment (as shown in FIG. 4), or use other stretchable trace which includes even more circular segments 12. Under such conditions, the circular segments 12 are allowed to have three or even more various central angles $\theta1$, $\theta2$, $\theta3$ . . . . Therefore, a proposed stretchable trace which is characterized by having a variety of curved angles is effectively formed, and the tensile stress in multiple directions can be therefore reduced significantly.

In the following sections, the Applicants further provide several multi-directional tensile experiments, in order to fully explain technical contents and to verify technical effects of the present invention. However, it should be obvious that, these verifications and data should not be read as limitations for the claim scope of the present invention.

Figure 6:
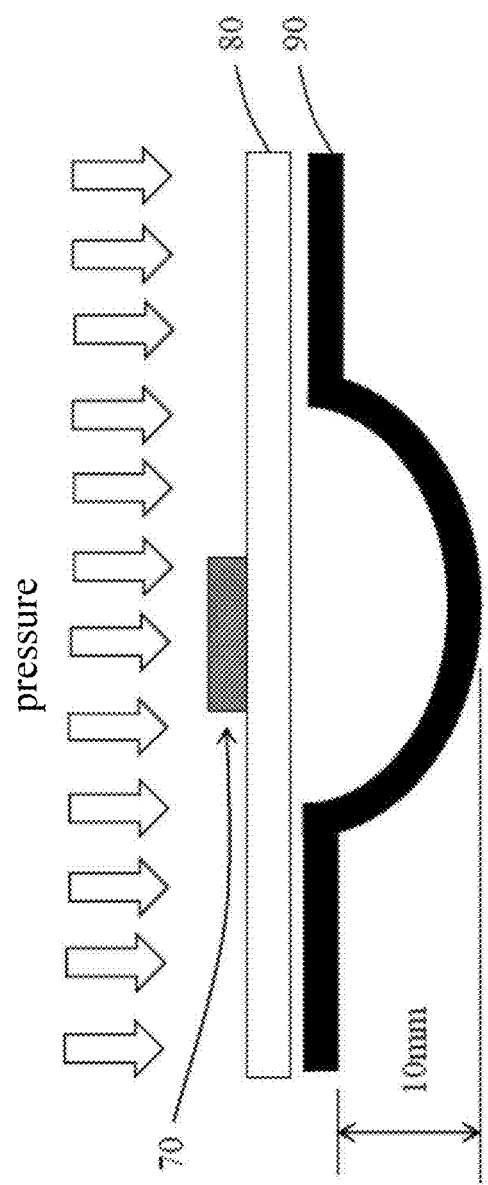
FIG. 6 schematically shows a structural drawing of an experimental device which is used for performing the multi-directional tensile experiments in accordance with the embodiments of the present invention.

Please refer to FIG. 6, which schematically shows a structural drawing of an experimental device which is used for performing the multi-directional tensile experiments in accordance with the embodiment of the present invention. Samples of the stretchable trace 70 to be tested include an experimental one, which is the proposed stretchable trace having a variety of curved angles of the present invention, and a control one, which is a conventional stretchable trace having merely one single curved angle. According to the experimental method process, the stretchable trace 70 is provided on the substrate film 80, and by using a simulation tool to thermally simulate it from a plane surface into a R40 hemispherical jig 90 having a depth of 10 mm. And hence, the tensile stress distribution on the stretchable trace of various curved angles under thermal stretching in multiple directions can be observed and retrieved.

Figure 7:
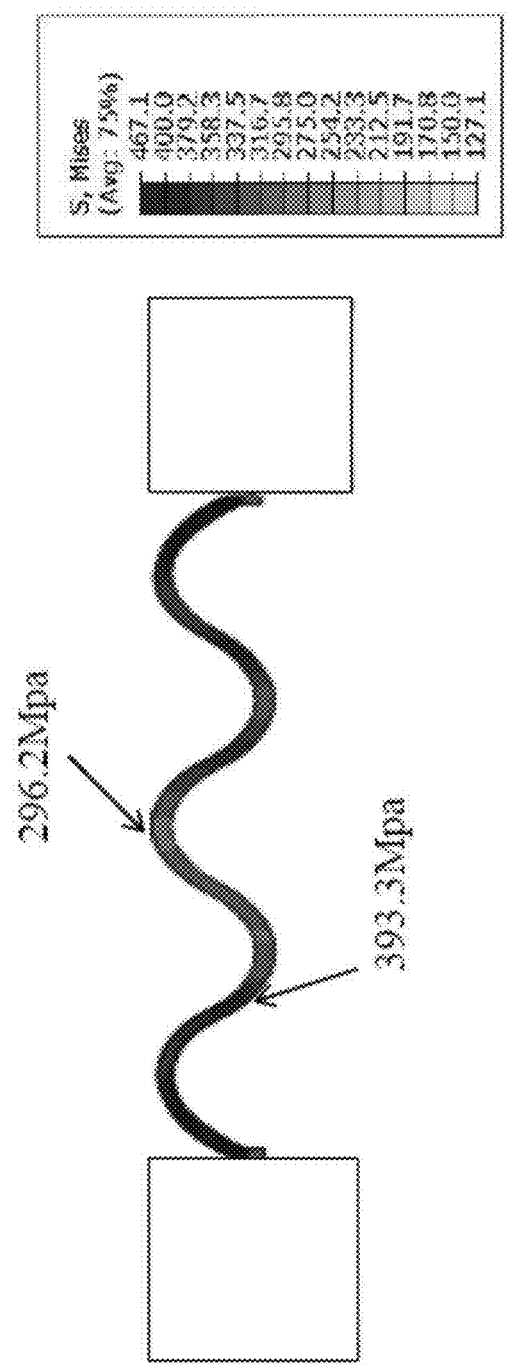
FIG. 7 illustrates the tensile stress distribution result of the experimental stretchable trace which has a variety of curved angles in multiple stretching directions in accordance with the embodiment of the present invention.
Figure 8:
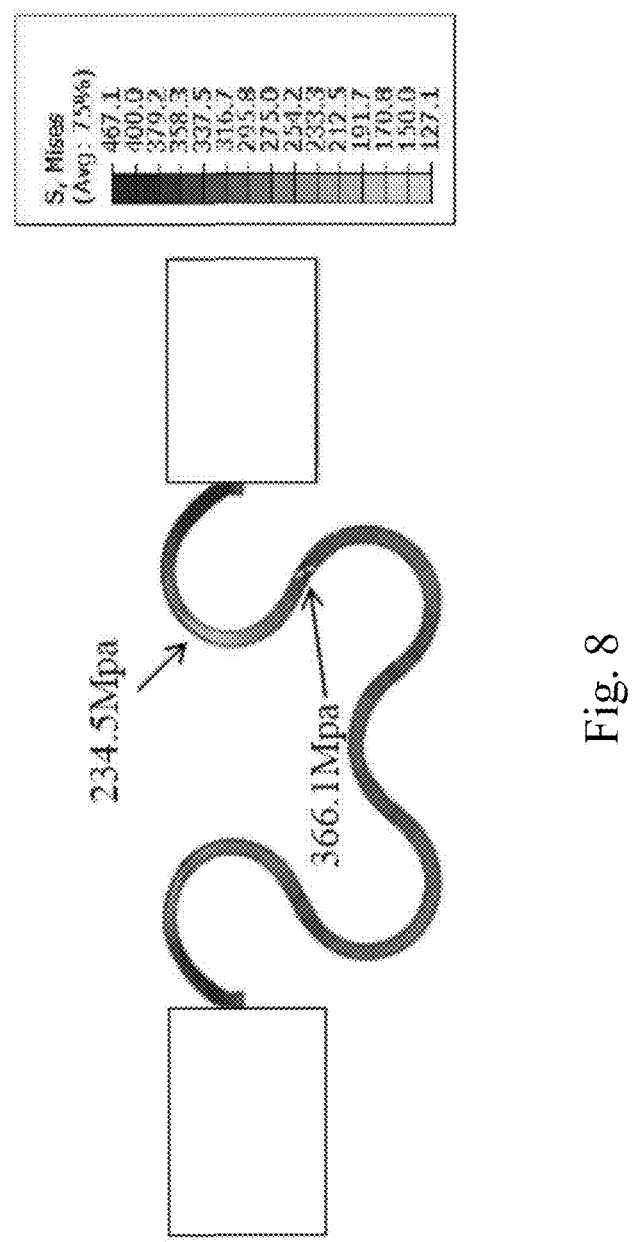
FIG. 8 illustrates the tensile stress distribution result of the control stretchable trace which has merely one single curved angle in multiple stretching directions.

Please refer to FIG. 7 and FIG. 8 for the tensile stress distribution results, in which FIG. 7 illustrates the tensile stress distribution of the experimental stretchable trace in multiple stretching directions, while FIG. 8 illustrates the tensile stress distribution of the control stretchable trace in multiple stretching directions. From the data results, it is obvious that the maximum stress on the experimental stretchable trace, which has a variety of curved angles, is reduced from 393.3 MPa to 366.1 MPa under a multi-stretching directions condition, while compared to the control stretchable trace which has merely one single curved angle. In addition, a minimum stress on the stretchable trace which has merely one single curved angle is 296.2 Mpa, and yet the minimum stress on the stretchable trace, which has a variety of curved angles, is only 234.5 MPa. And therefore, it is well proven that the proposed stretchable trace which has a variety of curved angles according to the present invention is effective to provide a lowered tensile stress when it is stretched in multiple stretching directions. Also, in view of the simulation results, the disclosed stretchable trace which has a variety of curved angles in the present invention achieves to significantly reduce the tensile stress applied on the stretchable trace itself even when it is stretched in multiple stretching directions.

To sum above, according to the tensile electronic module and electronic device in which the proposed tensile electronic module is applied to, it is obvious that, by designing the structure of the stretchable trace to have a variety of curved angles, the stretchable trace having a variety of curved angles when compared with the conventional one having merely one single curved angle, apparently can reduce the tensile stress in multiple stretching directions. And therefore, it can be further effectively applied to an electronic device which is stretchable or having a curved surface in order to prevent the stretchable trace from damages caused by stress accumulation of the external forces in multiple stretching directions. In addition, structural damages and performance degradations of the electronic device due to such stretching conditions can also be avoided, whereby it is believed that the product performance and the product service life of the electronic device are able to be guaranteed confirmatively.

According to the present invention, the disclosed tensile electronic module is applicable to an electronic device which is stretchable or having a curved surface, wherein its substrate thereof can be a substrate having flexibility or having a fixed curvature. For example, the substrate may be a piece of paper, plastic film, metal film, cloth, silicon substrate or glass substrate. The present invention is not limited thereto. In some alternative embodiments, it can also be applied to an electronic device having tensile stretching requirements, such as functional clothing, personal health sensors, stretchable display devices, curved display devices and any other related electronic products. As such, the orange peel effects generated from curing a thicker ink can be suppressed and prevented, thereby improving product quality and reliability, and enhancing market competitiveness of the products. As a result, it is believed that the present invention is instinct, effective and highly competitive for technologies and industries in the market nowadays, whereby having extraordinary availability and competitiveness for future industrial developments and being in condition for early allowance.

Overall, for those who are skilled in the art and having general knowledge backgrounds, appropriate modifications and/or variations with respective to the technical contents disclosed in the present invention without departing from the spirits of the present invention are allowed. However, it is worth noting that the modifications or variations should still fall into the claim scope of the present invention. The present invention is certainly not restricted by the certain limited configurations disclosed in the embodiments of the present invention.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A tensile electronic module, comprising:
   two electrical components; and
   a stretchable trace connected between the two electrical components, wherein the stretchable trace comprises two arcs and at least three circular segments, the at least three circular segments are connected to each other and have at least two various central angles, and wherein each of the two arcs is disposed at one end of the at least three circular segments for respectively connecting with one of the two electrical components;
   wherein the central angles of two adjacent circular segments of the at least three circular segments are different.

2. The tensile electronic module according to claim 1, wherein the central angles of each of the at least three circular segments are different.

3. The tensile electronic module according to claim 1, wherein each of the at least two various central angles is in a range between 90 degrees and 270 degrees.

4. The tensile electronic module according to claim 1, wherein the at least three circular segments have a same radius.

5. The tensile electronic module according to claim 1, wherein the at least three circular segments have a different radius.

6. The tensile electronic module according to claim 1, wherein the two arcs are circular arcs.

7. The tensile electronic module according to claim 1, wherein the stretchable trace is made of at least one material selected from a group consisting of copper, aluminum, silver, gold, titanium, molybdenum and nickel.

8. An electronic device, comprising:
   a substrate; and
   a tensile electronic module, comprising:
      two electrical components disposed on the substrate; and
      a stretchable trace disposed on the substrate and connected between the two electrical components, wherein the stretchable trace comprises two arcs and at least three circular segments, the at least three circular segments are connected to each other and have at least two various central angles, and wherein each of the two arcs is disposed at one end of the at least three circular segments for respectively connecting with one of the two electrical components;
      wherein the central angles of two adjacent circular segments of the at least three circular segments are different.

9. The electronic device according to claim 8, wherein the substrate is stretchable or having a fixed curvature.

10. The electronic device according to claim 9, wherein the substrate is a piece of paper, plastic film, metal film, cloth, silicon substrate or glass substrate.

11. The electronic device according to claim 8, wherein the central angles of each of the at least three circular segments are different.

12. The electronic device according to claim 8, wherein each of the at least two various central angles is in a range between 90 degrees and 270 degrees.

13. The electronic device according to claim 8, wherein the at least three circular segments have a same radius.

14. The electronic device according to claim 8, wherein the at least three circular segments have a different radius.

15. The electronic device according to claim 8, wherein the two arcs are circular arcs.

16. The electronic device according to claim 8, wherein the stretchable trace is made of at least one material selected from a group consisting of copper, aluminum, silver, gold, titanium, molybdenum and nickel.

\* \* \* \* \*